United States Patent
Zhang et al.

(10) Patent No.: US 12,426,442 B2
(45) Date of Patent: Sep. 23, 2025

(54) ARRAY SUBSTRATE AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Wei Zhang, Beijing (CN); Youngyik Ko, Beijing (CN); Quan Shi, Beijing (CN); Shanshan Bai, Beijing (CN); Hongli Wang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/781,792

(22) PCT Filed: Apr. 30, 2021

(86) PCT No.: PCT/CN2021/091626
§ 371 (c)(1),
(2) Date: Jun. 2, 2022

(87) PCT Pub. No.: WO2022/193414
PCT Pub. Date: Sep. 22, 2022

(65) Prior Publication Data
US 2025/0098467 A1    Mar. 20, 2025

(30) Foreign Application Priority Data

Mar. 16, 2021  (WO) .............. PCT/CN2021/081026

(51) Int. Cl.
*H10K 59/121*    (2023.01)
*H10K 59/122*    (2023.01)
(Continued)

(52) U.S. Cl.
CPC ........ *H10K 59/121* (2023.02); *H10K 59/122* (2023.02); *H10K 59/131* (2023.02);
(Continued)

(58) Field of Classification Search
CPC .. H10K 59/353; H10K 59/122; H10K 59/131; H10K 59/352; H10K 59/351; H10K 59/121
(Continued)

(56) References Cited

U.S. PATENT DOCUMENTS 10,901,314 B2    1/2021   Ji
2016/0078807 A1  3/2016   Sun et al.
(Continued)

FOREIGN PATENT DOCUMENTS

CN    104269411 A    1/2015
CN    105552102 A    5/2016
(Continued)

OTHER PUBLICATIONS

US Office Action from U.S. Appl. No. 17/790,979; Mailing Date: Nov. 1, 2024.
(Continued)

*Primary Examiner* — Theresa T Doan
(74) *Attorney, Agent, or Firm* — Dilworth & Barrese, LLP.; Michael J. Musella, Esq.

(57) ABSTRACT

The embodiments of the present disclosure provide an array substrate and a display device. The array substrate includes a plurality of first sub-pixel rows, each of which includes a plurality of first sub-pixels and a plurality of second sub-pixels alternately arranged in a first direction; and a plurality of second sub-pixel rows, each of which includes a plurality of third sub-pixels and a plurality of fourth sub-pixels alternately arranged in the first direction, the plurality of first sub-pixel rows and the plurality of second sub-pixel rows
(Continued)

are alternately arranged along a second direction, and in each of the first sub-pixel rows, an included angle between a connection line of a center of one of the first sub-pixels and a center of one of the second sub-pixels which are adjacent to each other and the first direction is less than 20 degrees.

19 Claims, 6 Drawing Sheets

(51) Int. Cl.
    *H10K 59/131*     (2023.01)
    *H10K 59/35*     (2023.01)

(52) U.S. Cl.
    CPC ......... *H10K 59/352* (2023.02); *H10K 59/353* (2023.02); *H10K 59/351* (2023.02)

(58) Field of Classification Search
    USPC .......................................................... 257/89
    See application file for complete search history.

(56) References Cited

U.S. PATENT DOCUMENTS

| | | | |
|---|---|---|---|
| 2016/0254476 A1 | 9/2016 | Park | |
| 2016/0357076 A1 | 12/2016 | Huangfu et al. | |
| 2018/0088260 A1 | 3/2018 | Jin et al. | |
| 2018/0315801 A1 | 11/2018 | Matsueda | |
| 2019/0140030 A1 | 5/2019 | Huangfu et al. | |
| 2019/0252469 A1 | 8/2019 | Xiao et al. | |
| 2020/0013833 A1 | 1/2020 | Wang et al. | |
| 2020/0043990 A1 | 2/2020 | Huangfu et al. | |
| 2020/0066809 A1 | 2/2020 | Liu | |
| 2020/0212125 A1* | 7/2020 | Liu | H10K 59/353 |
| 2020/0312941 A1 | 10/2020 | Na et al. | |
| 2020/0357862 A1 | 11/2020 | Wang et al. | |
| 2021/0335909 A1 | 10/2021 | Wang et al. | |
| 2022/0310712 A1 | 9/2022 | Zhao et al. | |
| 2023/0058293 A1 | 2/2023 | Liu et al. | |

FOREIGN PATENT DOCUMENTS

| | | |
|---|---|---|
| CN | 205355055 U | 6/2016 |
| CN | 107644888 A | 1/2018 |
| CN | 107968103 A | 4/2018 |
| CN | 207883217 U | 9/2018 |
| CN | 208077981 U | 11/2018 |
| CN | 110137213 A | 8/2019 |
| CN | 110459574 A | 11/2019 |
| CN | 110599954 A | 12/2019 |
| CN | 110690266 A | 1/2020 |
| CN | 111341817 A | 6/2020 |
| CN | 111755483 A | 10/2020 |
| CN | 112038375 A | 12/2020 |
| EP | 3419054 A1 | 5/2016 |
| WO | 2018090630 A | 5/2018 |

OTHER PUBLICATIONS

Extended European search report issued by the European Patent Office in European Application No. 22770557.1; Mailing Date: Sep. 27, 2023.

Extended European search report issued by the European Patent Office in European Application No. 22770568.8; Mailing Date: Oct. 12, 2023.

Final Office Action of U.S. Appl. No. 17/790,979; Mailing Date: Mar. 20, 2025.

Non-Final Office Action of U.S. Appl. No. 17/790,577; Mailing Date: Mar. 31, 2025.

* cited by examiner

ARRAY SUBSTRATE AND DISPLAY DEVICE

This application claims priority to PCT application PCT/CN2021/081026 filed on Mar. 16, 2021, the present disclosures of which are incorporated herein by reference in their entirety as part of the present disclosure.

TECHNICAL FIELD

The embodiment of the present disclosure relates to an array substrate and a display device.

BACKGROUND

With the continuous development of display technology, people have higher and higher requirements for display quality of display devices. Organic light-emitting diode (OLED) display device are used more and more widely, due to their advantages of wide color gamut, fast response, foldable, bendable and high contrast ratio. On the other hand, people have higher and higher requirements for the resolution of the organic light-emitting diode (OLED) display devices.

In the organic light-emitting diode (OLED) display devices, a pixel arrangement mode or a pixel arrangement structure has a great influence on the display quality and the resolution, thus the pixel arrangement mode or the pixel arrangement structure is also one of the important directions for major manufacturers to study and improve.

SUMMARY

At least one embodiment of the present disclosure provides an array substrate and a display device. In the array substrate, the first sub-pixel row includes a plurality of first sub-pixels and a plurality of second sub-pixels arranged alternately in a first direction. Because an included angle between a connection line of a center of a first sub-pixel and a center of a second sub-pixel which are adjacent to each other and the first sub-pixel row and the first direction is less than 20 degrees, so that a fluctuation sense of the sub-pixel row is smaller, the sub-pixel row looks closer to a straight line in human vision, thus, the "sense of fluctuation" or "sense of jaggedness" of a display image can be alleviated or even eliminated, and the lines of the display image can be more continuous and natural.

At least one embodiment of the present disclosure provides an array substrate, which includes: a plurality of first sub-pixel rows, each of the first sub-pixel rows includes a plurality of first sub-pixels and a plurality of second sub-pixels alternately arranged in a first direction; and a plurality of second sub-pixel rows, each of the second sub-pixel rows includes a plurality of third sub-pixels and a plurality of fourth sub-pixels alternately arranged in the first direction, the plurality of first sub-pixel rows and the plurality of second sub-pixel rows are alternately arranged along a second direction, and the second direction is intersected with the first direction, and in each of the first sub-pixel rows, an included angle between a connection line of a center of one of the first sub-pixels and a center of one of the second sub-pixels which are adjacent to each other and the first direction is less than 20 degrees.

For example, in the array substrate provided by an embodiment of the present disclosure, the first sub-pixels are configured to emit light of a first color, the second sub-pixels are configured to emit light of a second color, and the first color and the second color are the same.

For example, in the array substrate provided by an embodiment of the present disclosure, the third sub-pixels are configured to emit light of a third color, the fourth sub-pixels are configured to emit light of a fourth color, the third color, the fourth color and the first color are different from each other, and a luminous efficiency of each of the third sub-pixels is greater than a luminous efficiency of each of the fourth sub-pixels.

For example, in the array substrate provided by an embodiment of the present disclosure, the array substrate further includes: a plurality of pixel groups, each of the plurality of pixel groups includes one of the first color sub-pixels, one of the second sub-pixels, one of the third sub-pixels and one of the fourth sub-pixels, in each of the plurality of pixel groups, a first connection line of a center of the one of the first sub-pixels and a center of the one of the second sub-pixels is intersected with a second connection line between a center of the one of the third sub-pixels and a center of the one of the fourth sub-pixels, the plurality of pixel groups are arranged along the first direction to form N pixel group rows, the N pixel group rows are arranged in the second direction, two adjacent ones of the pixel group rows are arranged in a staggered manner in the first direction, and multiple first sub-pixels in an i-th pixel group row and multiple second sub-pixels in an (i+1)-th pixel group row are alternately arranged in the first direction, to form one of the first sub-pixel rows, multiple third sub-pixels and multiple fourth sub-pixels in the i-th pixel group row are alternately arranged in the first direction, to form one of the second sub-pixel rows, N is a positive integer greater than or equal to 3, and i is a positive integer greater than or equal to 1 and less than or equal to N.

For example, in the array substrate provided by an embodiment of the present disclosure, in one of the first sub-pixel rows, the included angle between the connection line of the center of the one of the first sub-pixels and the center of the one of the second sub-pixels which are adjacent to each other and the first direction is less than 15 degrees.

For example, in the array substrate provided by an embodiment of the present disclosure, in one of the first sub-pixel rows, the included angle between the connection line of the center of the one of the first sub-pixels and the center of the one of the second sub-pixels which are adjacent to each other and the first direction is less than or equal to 10 degrees.

For example, in the array substrate provided by an embodiment of the present disclosure, each of the first sub-pixels and each of the second sub-pixels in one of the first sub-pixel rows are intersected with a first virtual straight line extending in the first direction.

For example, in the array substrate provided by an embodiment of the present disclosure, the plurality of the first sub-pixels and the plurality of the second sub-pixels in one of the first sub-pixel rows are uniformly distributed in the first direction.

For example, in the array substrate provided by an embodiment of the present disclosure, a ratio of a maximum size of one of the third sub-pixels in the second direction to a maximum size of the one of the third sub-pixels in the first direction is less than 2.

For example, in the array substrate provided by an embodiment of the present disclosure, the ratio of the maximum size of the one of the third sub-pixels in the second direction to the maximum size of the one of the third sub-pixels in the first direction is less than 1.2.

For example, in the array substrate provided by an embodiment of the present disclosure, a shape of an effective light-emitting region of one of the third sub-pixels includes a first parallel edge group, the first parallel edge group includes a first parallel edge and a second parallel edge extending along the second direction, and in one of the pixel groups, the first parallel edge is located at a side of the second parallel edge away from the fourth sub-pixel, and a length of the first parallel edge is greater than a length of the second parallel edge.

For example, in the array substrate provided by an embodiment of the present disclosure, a shape of an effective light-emitting region of one of the fourth sub-pixels includes a second parallel edge group, the second parallel edge group includes a third parallel edge and a fourth parallel edge extending along the second direction, and in one of the pixel groups, the third parallel edge is located at a side of the fourth parallel edge away from the third sub-pixel, and a length of the third parallel edge is greater than a length of the fourth parallel edge.

For example, in the array substrate provided by an embodiment of the present disclosure, a shape of the effective light-emitting region of one of the third sub-pixels includes a first vertex and a second vertex with a largest distance in the second direction, the shape of the effective light-emitting region of the one of the third sub-pixels is divided into a first part and a second part by a connection line of the first vertex and the second vertex, and in one of the pixel groups, the first part is located at a side of the second part away from the fourth sub-pixels, and an average size of the first part in the second direction is greater than an average size of the second part in the second direction.

For example, in the array substrate provided by an embodiment of the present disclosure, the shape of the effective light-emitting region of one of the fourth sub-pixels includes a third vertex and a fourth vertex with a largest distance in the second direction, the shape of the effective light-emitting region of the fourth sub-pixel is divided into a third part and a fourth part by a connection line of the third vertex and the fourth vertex, and in one of the pixel groups, the third part is located at a side of the fourth part away from the third sub-pixel, an average size of the third part in the second direction is greater than an average size of the fourth part in the second direction.

For example, in the array substrate provided by an embodiment of the present disclosure, a shortest distance D1 between an effective light-emitting region of one of the third sub-pixels in the i-th pixel group row and an effective light-emitting region of one of the fourth sub-pixels in the (i+1)-th pixel group row is less than twice a shortest distance between an effective light-emitting region of one of the first sub-pixels and an effective light-emitting region of one of the third sub-pixels in a same pixel group.

For example, in the array substrate provided by an embodiment of the present disclosure, the shortest distance D1 between the effective light-emitting region of one of the third sub-pixels in the i-th pixel group row and the effective light-emitting region of one of the fourth sub-pixels in the (i+1)-th pixel group row is less than 1.5 times the shortest distance between the effective light-emitting region of one of the first sub-pixels and the effective light-emitting region of one of the third sub-pixels in the same pixel group.

For example, in the array substrate provided by an embodiment of the present disclosure, a shortest distance D2 between an effective light-emitting region of one of the fourth sub-pixels in the i-th pixel group row and an effective light-emitting region of one of the third sub-pixels in the (i+1)-th pixel group row is less than twice a shortest distance between the effective light-emitting region of one of the first sub-pixels and the effective light-emitting region of one of the fourth sub-pixels in a same pixel group.

For example, in the array substrate provided by an embodiment of the present disclosure, the shortest distance D2 between the effective light-emitting region of one of the fourth sub-pixels in the i-th pixel group row and the effective light-emitting region of one of the third sub-pixels in the (i+1)-th pixel group row is less than 1.5 times the shortest distance between the effective light-emitting region of one of the first sub-pixels and the effective light-emitting region of one of the fourth sub-pixels in the same pixel group.

For example, in the array substrate provided by an embodiment of the present disclosure, the first sub-pixel in one of the pixel groups in the i-th pixel group row is at least partially located between two adjacent pixel groups in the (i+1)-th pixel group row.

For example, in the array substrate provided by an embodiment of the present disclosure, the i-th pixel group row is aligned with the (i+2)-th pixel group row in the first direction, one of the first sub-pixels in the i-th pixel group row and one of the second sub-pixels in the (i+2)-th pixel group row form a sub-pixel pair, and in the sub-pixel pair, a third connection line of a center of the first sub-pixel and a center of the second sub-pixel is parallel to the second direction.

For example, in the array substrate provided by an embodiment of the present disclosure, a farthest distance in the second direction between an effective light-emitting region of the first sub-pixel and an effective light-emitting region of the second sub-pixel in the sub-pixel pair is greater than a size of the third sub-pixel in the second direction and a size of the fourth sub-pixel in the second direction.

For example, in the array substrate provided by an embodiment of the present disclosure, in the sub-pixel pair, a light-emitting layer of the first sub-pixel and a light-emitting layer of the second sub-pixel are integrated into a same light-emitting layer.

For example, in the array substrate provided by an embodiment of the present disclosure, the array substrate further includes: a spacer, the spacer is located between one of the first sub-pixels and one of the second sub-pixels which are adjacent to each other in the first sub-pixel row.

For example, in the array substrate provided by an embodiment of the present disclosure, a number of the plurality of the second sub-pixel rows is K, the spacer is further located between the third sub-pixel in a j-th second sub-pixel row and the fourth sub-pixel in a (j+1)-th second sub-pixel row, or the spacer is further located between the fourth sub-pixel in a j-th second sub-pixel row and the third sub-pixel in a (j+1)-th second sub-pixel row, K is a positive integer greater than or equal to 3, and j is a positive integer greater than or equal to 1 and less than or equal to K.

At least one embodiment of the present disclosure provides a display device, which includes any one of the abovementioned array substrates.

BRIEF DESCRIPTION OF THE DRAWINGS

In order to clearly illustrate the technical solution of the embodiments of the present disclosure, the drawings of the embodiments will be briefly described. It is apparent that the described drawings are only related to some embodiments of the present disclosure and thus are not limitative of the present disclosure.

DETAILED DESCRIPTION

In order to make objects, technical details and advantages of embodiments of the present disclosure clear, the technical solutions of the embodiments will be described in a clearly and fully understandable way in connection with the related drawings. It is apparent that the described embodiments are just a part but not all of the embodiments of the present disclosure. Based on the described embodiments herein, those skilled in the art can obtain, without any inventive work, other embodiment(s) which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or a mechanical connection, but may comprise an electrical connection which is direct or indirect.

In general, resolution of a display device can be increased by reducing sizes of pixels and reducing spacings between pixels. However, the reducing of the sizes of the pixels and the reducing of the spacings between the pixels also requires higher and higher precision of a corresponding manufacturing process, so that difficulty of the manufacturing process and manufacturing cost of the display device are increased. On the other hand, a sub-pixel rendering (Sup-Pixel Rendering, SPR) technology can use difference in resolution of different color sub-pixels by the human eye, to change a conventional mode of simply defining a pixel by using red, green, and blue sub-pixels, by sharing certain positional resolution-insensitive color sub-pixels between different pixels, with a relatively small number of sub-pixels, performance capability of a same pixel resolution is achieved by simulation, so that the difficulty of the manufacturing process and the manufacturing cost are reduced. However, a pixel arrangement structure using the sub-pixel rendering (SPR) technology will have some adverse effects on the display quality, for example, the display image has a grainy and wavy feeling, and the lines in the display image are discontinuous.

Figure 1A:
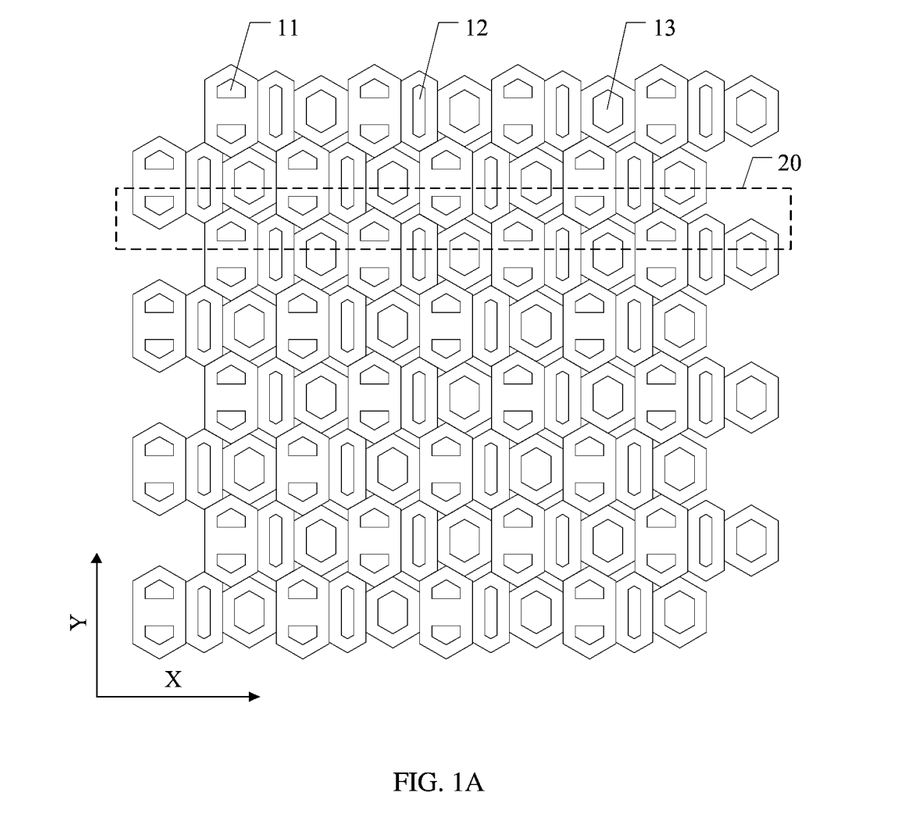
FIG. 1A is a schematic diagram of an array substrate.
Figure 1B:
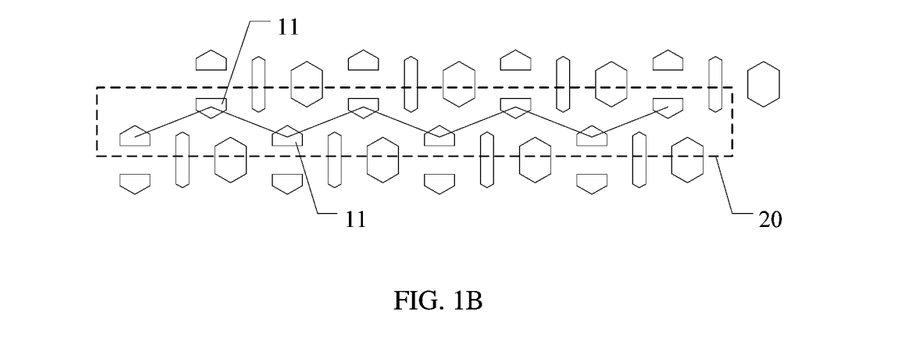
FIG. 1B is a schematic diagram of a sub-pixel row in an array substrate.

FIG. 1A is a schematic diagram of an array substrate; FIG. 1B is a schematic diagram of a sub-pixel row in an array substrate. As shown in FIG. 1A, the array substrate 10 includes a first sub-pixel 11, a second sub-pixel 12 and a third sub-pixel 13. A color of light emitted by the first sub-pixel 11 can be a color sensitive to human eyes, that is, in a case that a human eye performs visual synthesis, the color of the light emitted by the first sub-pixel 11 accounts for a higher proportion. As shown in FIG. 1B, in a sub-pixel row 20 formed by the first sub-pixel 11 along the first direction, positions of adjacent first sub-pixels 11 in the second direction are quite different, that is, a distance between the centers of the adjacent first sub-pixels 11 in the second direction is relatively large; therefore, in a case that the array substrate is used for straight lines, the straight lines in human vision has a strong "sense of fluctuation" or "sense of jaggedness", so that the quality of the displayed image is degraded.

In this regard, embodiments of the present disclosure provide an array substrate and a display device. The array substrate includes a plurality of pixel groups, each of the pixel groups includes a first sub-pixel, a second sub-pixel, a third sub-pixel and a fourth sub-pixel; in each of the pixel groups, a first connection line of a center of one of the first sub-pixels and a center of one of the second sub-pixels is intersected with a second connection line of a center of one of the third sub-pixels and a center of one of the fourth sub-pixels; the plurality of pixel groups are arranged along the first direction to form N pixel group rows, the N pixel group rows are arranged in the second direction, two adjacent pixel group rows are arranged in a staggered manner in the first direction; multiple first sub-pixels in the i-th pixel group row and multiple second sub-pixels in the (i+1)-th pixel group row are alternately arranged in the first direction, to form one of the sub-pixel rows, in each of the sub-pixel rows, an included angle between a connection line of a center of one of the first sub-pixels and a center of one of the second sub-pixels that are adjacent to each other and the first direction is less than 20 degrees, N is a positive integer greater than or equal to 3, and i is a positive integer greater than or equal to 1 and less than or equal to N. In the array substrate, the first sub-pixels and the second sub-pixels may be sub-pixels that emit light of a same color, and the color can be a sub-pixel that is sensitive to the human eye. Because the included angle between the connection line of the center of the one of the first sub-pixels and the center of the one of the second sub-pixels that are adjacent to each other and the first direction is less than 20 degrees, the fluctuation of the sub-pixel row is smaller, the sub-pixel row is closer to a straight line in human vision, so that the "sense of fluctuation" or "sense of jaggedness" of the display image can be alleviated or even eliminated, and thus lines of the display image are more continuous and natural.

Hereinafter, the array substrate and the display device provided by the embodiments of the present disclosure will be described in detail with reference to the accompanying drawings.

Figure 2A:
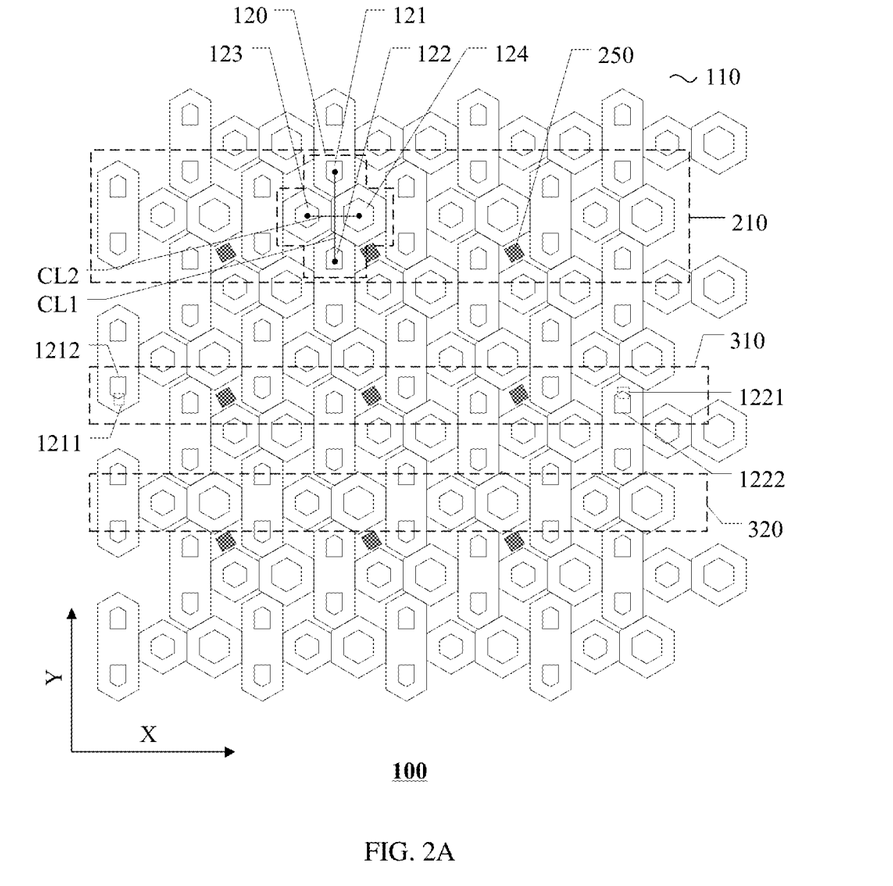
FIG. 2A is a schematic diagram of an array substrate provided by an embodiment of the present disclosure.
Figure 2B:
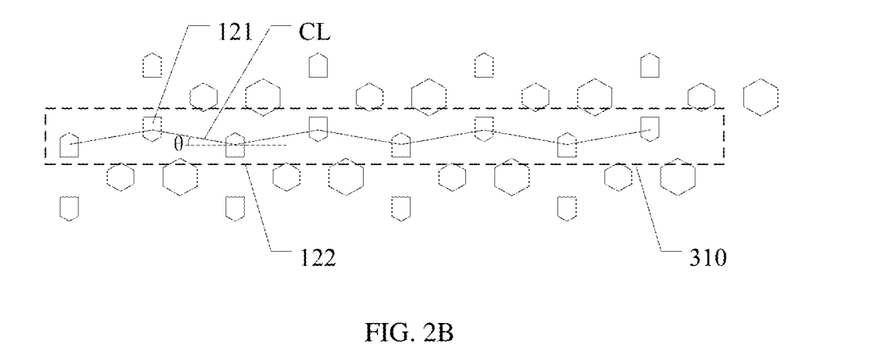
FIG. 2B is a schematic diagram of a display effect of a sub-pixel row in an array substrate provided by an embodiment of the present disclosure.

An embodiment of the present disclosure provides an array substrate. FIG. 2A is a schematic diagram of an array substrate provided by an embodiment of the present disclosure. FIG. 2B is a schematic diagram of a display effect of a sub-pixel row in an array substrate provided by an embodiment of the present disclosure.

As shown in FIG. 2A and FIG. 2B, the array substrate 100 includes a plurality of first sub-pixel rows 310 and a plurality of second sub-pixel rows 320; each of the first sub-pixel rows 310 includes a plurality of first sub-pixels 121 and a plurality of second sub-pixels 122 arranged alternately in the first direction; each of the second sub-pixel rows 320 includes a plurality of third sub-pixels 123 and a plurality of fourth sub-pixels 124 arranged alternately in the first direction; the plurality of first sub-pixel rows 310 and the plurality of second sub-pixel rows 320 are alternately arranged along the second direction. The second direction is intersected with the first direction, for example, the second direction and the first direction are perpendicular to each other. It should be noted that, the above-mentioned "the second direction and the first direction are perpendicular to each other" includes that the first direction and the second direction are strictly perpendicular to each other, that is, a case that an included angle between the first direction and the second direction is 90 degrees, and also includes that the first direction and the second direction are substantially perpendicular to each other, that is, a case that the included angle between the first direction and the second direction is in a range of 80 degrees to 100 degrees.

As shown in FIGS. 2A and 2B, in one of the first sub-pixel rows 310, the included angle between the connection line of the center of the first sub-pixel 121 and the center of the second sub-pixel 122 that are adjacent to each other and the first direction is less than 20 degrees.

In the array substrate provided by the embodiment of the present disclosure, the first sub-pixel 121 and the second sub-pixel 122 may be sub-pixels that emit light of the same color, and the color of the sub-pixels is sensitive to the human eye. Because the included angle θ between the connection line of the center of the first sub-pixel 121 and the center of the second sub-pixel 122 that are adjacent to each other in the first sub-pixel row 310 and the first direction is less than 20 degrees, the fluctuation of the first sub-pixel row 310 is smaller, and the first sub-pixel row 310 is closer to a straight line in human vision, which can alleviate or even eliminate the "sense of fluctuation" or "sense of jaggedness" of the display image, and make the lines of the display image more continuous and natural.

In some examples, as shown in FIG. 2A, the array substrate 100 includes a base substrate 110 and a plurality of pixel groups 120 located on the base substrate 110; each of the plurality of pixel group 120 includes a first sub-pixel 121, a second sub-pixel 122, a third sub-pixel 123 and a fourth sub-pixel 124. In each of the plurality of the pixel groups 120, a first connection line CL1 between a center of the first sub-pixel 121 and a center of the second sub-pixel 122 is intersected with a second connection line CL2 between a center of the third sub-pixel 123 and a center of the fourth sub-pixel 124. It should be noted that, in the pixel group 120, the first sub-pixel 121 and the second sub-pixel 122 can be sub-pixels that emit light of a same color; in addition, shapes of the first sub-pixel 121 and the second sub-pixel 122 may also be the same, and the difference between the first sub-pixel 121 and the second sub-pixel 122 is that their positions are different. In addition, the above-mentioned "center" refers to a luminance center or a geometric center of an effective light-emitting region of each of the sub-pixels.

As shown in FIG. 2A, the plurality of pixel groups 120 are arranged along the first direction to form N pixel group rows 210; the N pixel group rows 210 are arranged in the second direction, two pixel group rows 210 which are adjacent to each other are arranged in a staggered manner in the first direction, that is, centers of orthographic projections of the pixel groups with a same ordinal number in the two pixel group rows 210 which are adjacent to each other on a reference line extending in the first direction do not overlap. Therefore, the two pixel group rows 210 which are adjacent to each other can be arranged closer and more closely in the second direction, so as to improve the pixel density or resolution.

As shown in FIGS. 2A and 2B, multiple first sub-pixels 121 in an i-th pixel group row 210 and multiple second sub-pixels 122 in an (i+1)-th pixel group row 210 are alternately arranged in the first direction, to form the above-mentioned first sub-pixel row 310; in addition, in a first sub-pixel row 310, an included angle θ between a connection line of a center of the first sub-pixel 121 and a center of the second sub-pixel 122 that are adjacent to each other and the first direction is less than 20 degrees, N is a positive integer greater than or equal to 3, and i is a positive integer greater than or equal to 1 and less than or equal to N.

In the array substrate provided by the embodiment of the present disclosure, the first sub-pixel 121 and the second sub-pixel 122 may be sub-pixels that emit light of a same color, and the color of the sub-pixels is sensitive to the human eye. Because the included angle θ between the connection line of the center of the first sub-pixel 121 and the center of the second sub-pixel 122 that are adjacent to each other in the first sub-pixel row 310 and the first direction is less than 20 degrees, the sense of fluctuation of the first sub-pixel row 310 is smaller, and the first sub-pixel row 310 is closer to a straight line in human vision, so that the "sense of fluctuation" or "sense of jaggedness" of the display image can be alleviated or even eliminated, and thus the lines of the display image are more continuous and natural.

In addition, in one of the pixel groups 120, the sub-pixel rendering (SPR) technology may be used to make that that the first sub-pixel 121 and the second sub-pixel 122 use the third sub-pixel 123 and the fourth sub-pixel 124 respectively to form two pixels in an analog manner, so that the pixel resolution can be improved, and the difficulty of the manufacturing process and the manufacturing cost can be reduced.

For example, multiple third sub-pixels 123 and multiple fourth sub-pixels 124 in the i-th pixel group row 210 are alternately arranged in the first direction, to form a second sub-pixel row 320.

In some examples, the first sub-pixel is configured to emit light of a first color, the second sub-pixel is configured to emit light of a second color, and the first color and the second color are the same. For example, the first sub-pixel 121 and the second sub-pixel 122 are configured to emit green light, that is, both the first color and the second color are green. It should be noted that the green light is sensitive to the human eye, thus in human vision, a brightness center of the pixel will be close to a brightness center of a green sub-pixel.

In some examples, the third sub-pixel is configured to emit light of a third color, the fourth sub-pixel is configured to emit light of a fourth color, the third color, the fourth color and the first color are different from each other, a luminous efficiency of the third sub-pixel is greater than a luminous efficiency of the fourth sub-pixel. For example, the first color and the second color are green, the third color is red, and the fourth color is blue. Of course, the embodiments of the present disclosure include but are not limited to this.

In some examples, as shown in FIG. 2A, further, in the first sub-pixel row 310, the included angle θ between the connection line of the center of the first sub-pixel 121 and the center of the second sub-pixel 122 that are adjacent to each other and the first direction is less than 15 degrees. Because the included angle θ between the connection line of the center of the first sub-pixel 121 and the center of the second sub-pixel 122 that are adjacent to each other and the first direction is less than 15 degrees, the sense of fluctuation of the first sub-pixel row 310 can be further reduced, so that the "sense of fluctuation" or "sense of jaggedness" of the display image can be further alleviated or even eliminated.

In some examples, as shown in FIG. 2A, in the first sub-pixel row 310, the included angle θ between the connection line of the center of the first sub-pixel 121 and the center of the second sub-pixel 122 that are adjacent to each other and the first direction is in the range of 9 degrees to 11 degrees, for example, 10 degrees. In this way, the array substrate can make the included angle between the connection line CL and the first direction smaller by changing aspect ratios of the third sub-pixel and the fourth sub-pixel, so that the "sense of fluctuation" or "sense of jaggedness" of the display image is further alleviated or even eliminated.

In some examples, as shown in FIGS. 2A and 2B, orientations of the first sub-pixels 121 and the second sub-pixels 122 that are adjacent to each other in the first sub-pixel row 310 are different, that is, shapes of orthographic projections of the first sub-pixel 121 on the base substrate 110 are exactly the same as shapes of orthographic projections of the second sub-pixels 122 on the base substrate 110 after being rotated by a certain angle (for example, 180 degrees).

In some examples, as shown in FIGS. 2A and 2B, shapes of the orthographic projections of the first sub-pixels 121 on the base substrate 110 include first protrusions 1211, shapes of the orthographic projections of the second sub-pixels 122 on the base substrate 110 include second protrusions 1221, and orientations of the first protruding portions 1211 and the second protruding portions 1221 are opposite.

In some examples, as shown in FIGS. 2A and 2B, the shapes of the orthographic projections of the first sub-pixels 121 on the base substrate 110 further include first bottom edges 1212 arranged opposite to the first protrusions 1211, the shapes of the orthographic projections of the second sub-pixels 122 on the base substrate 110 include second bottom edges 1222 arranged opposite to the second protrusions 1221, the first bottom edges 1212 and the second bottom edges 1222 are not located on a same straight line.

In some examples, as shown in FIGS. 2A and 2B, edges of the adjacent first sub-pixels 121 and the second sub-pixels 122 in the first sub-pixel row 310 close to the same second sub-pixel row are uneven (for example, lower edges in FIG. 2A are uneven).

In some examples, as shown in FIGS. 2A and 2B, the plurality of first sub-pixels 121 and the plurality of second sub-pixels 122 in one of the first sub-pixel rows 310 are intersected with a first virtual straight line extending in the first direction. That is, the first virtual straight line extending in the first direction simultaneously passes through the plurality of first sub-pixels 121 and the plurality of second sub-pixels 122 in one of the first sub-pixel rows 310. In this way, the plurality of first sub-pixels 121 and the plurality of second sub-pixels 122 in the first sub-pixel row are closer to a straight line in human vision, thus the fluctuation of the first sub-pixel row 310 can be further alleviated, so that the "sense of fluctuation" or "sense of jaggedness" of the display image can be further alleviated or even eliminated.

In some examples, as shown in FIGS. 2A and 2B, the plurality of first sub-pixels 121 and the plurality of second sub-pixels 122 in the first sub-pixel row 310 are uniformly distributed in the first direction, so that the display quality of the array substrate can be improved.

In some examples, as shown in FIG. 2A, in the same pixel group row 120, centers of all of the first sub-pixels 121 may be located on a same straight line; centers of all of the second sub-pixels 121 may be located on a same straight line; centers of all of the third sub-pixels 123 may be located on a same straight line; centers of all of the fourth sub-pixels 124 may be located on a same straight line.

In some examples, as shown in FIG. 2A, in each of the pixel groups 120, no other sub-pixel is arranged between the first sub-pixel 121 and the third sub-pixel 123, no other sub-pixel is arranged between the first sub-pixel 121 and the fourth sub-pixel 124; similarly, no other sub-pixel is arranged between the second sub-pixel 122 and the third sub-pixel 123, and no other sub-pixel is arranged between the second sub-pixel 122 and the fourth sub-pixel 124.

In some examples, as shown in FIG. 2A, the array substrate 100 further includes: sub-pixel intervals 170, which are arranged between two adjacent sub-pixels, the sub-pixels can be any one kind of the first sub-pixels 121, the second sub-pixels 122, the third sub-pixels 123 and the fourth sub-pixels mentioned above; each of the pixel groups 120 includes only four sub-pixels separated by the sub-pixel intervals 170.

In some examples, as shown in FIG. 2A, the array substrate 100 further includes spacers 250, the spacers 250 can be used to support a mask (for example, a fine metal mask) for forming the first sub-pixels, the second sub-pixels, the third sub-pixels and the fourth sub-pixels mentioned above during the manufacturing process of the array substrate. The spacers 250 are located between the first sub-pixels 121 and the second sub-pixels 122 that are adjacent to each other in the first sub-pixel row 310.

In the array substrate provided by the embodiments of the present disclosure, because the included angle θ between the connection line of the center of the first sub-pixel 121 and the center of the second sub-pixel 122 that are adjacent to each other in the first sub-pixel row 310 and the first direction is decreased, that is, a distance between the first sub-pixel 121 and the second sub-pixel 122 that are adjacent to each other in the second direction is reduced, thus the aspect ratios of the third sub-pixels and the fourth sub-pixels are decreased, so that blank areas are left between the first sub-pixels 121 and the second sub-pixels 122 that are adjacent to each other. The array substrate can use the blank area to set spacers, so that the spacers can be prevented from rubbing against an opening edge of the mask during the manufacturing process to generate particles, then adverse effects of the particles on the display quality can be avoided.

In some examples, as shown in FIG. 2A, a number of the plurality of second sub-pixel rows 320 is K, the spacers are further located between the third sub-pixel in the j-th second sub-pixel row and the fourth sub-pixel in the (j+1)-th second sub-pixel row, or the spacers are further located between the fourth sub-pixel in the j-th second sub-pixel row and the third sub-pixel in the (j+1)-th second sub-pixel row, K is a positive integer greater than or equal to 3, and j is a positive integer greater than or equal to 1 and less than or equal to K. In some examples, as shown in FIG. 2A, the array substrate 100 includes a plurality of spacers 250, lines connecting centers of the plurality of spacers 250 may form a rectangular grid or a diamond grid.

In some examples, as shown in FIG. 2A, the centers of all of the third sub-pixels 123 and the fourth sub-pixels 124 in the second sub-pixel row 320 may be located on a virtual straight line extending along the first direction, so that display symmetry can be improved.

Figure 3A:
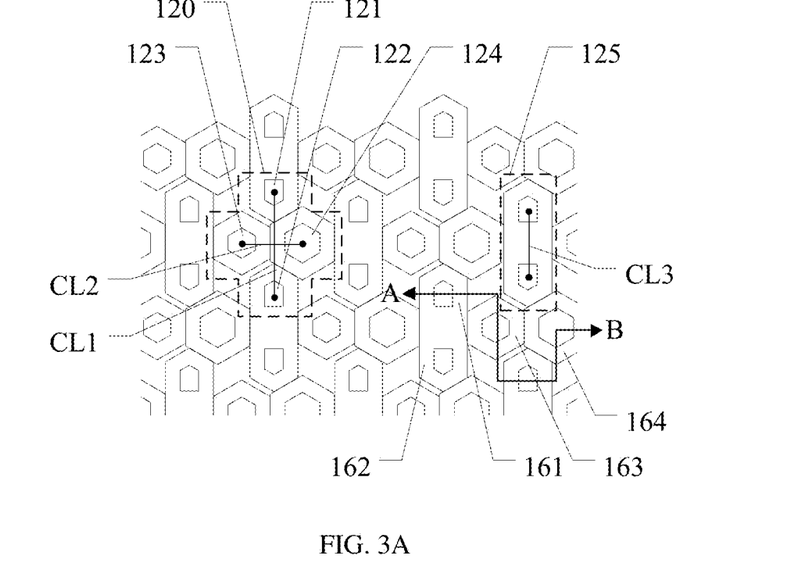
FIG. 3A is a partial schematic diagram of an array substrate provided by an embodiment of the present disclosure.
Figure 3B:
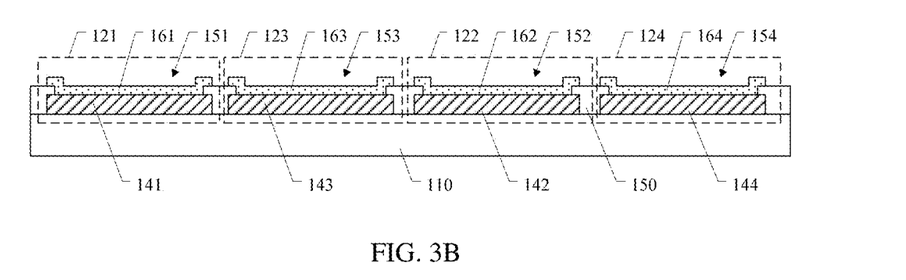
FIG. 3B is a cross-sectional schematic diagram of an array substrate along an AB direction in FIG. 3A provided by an embodiment of the present disclosure.

FIG. 3A is a partial schematic diagram of an array substrate provided by an embodiment of the disclosure; and FIG. 3B is a cross-sectional schematic diagram of an array substrate along an AB direction in FIG. 3A provided by an embodiment of the present disclosure.

In some examples, as shown in FIGS. 2A and 3A, a ratio of a size of the third sub-pixel 123 in the second direction to a size of the third sub-pixel 123 in the first direction is less than 3.5. In this way, by reducing an aspect ratio of the third sub-pixel 123, the centers of the first sub-pixels 121 and the centers of the second sub-pixels 122 that are adjacent in the first sub-pixel row 310 can be set closer, for example, the included angle between the connection line of the center of the first sub-pixel 121 and the center of the second sub-pixel 122 that are adjacent to each other and the first direction is less than 15 degrees. On the other hand, by arranging the ratio of the size of the third sub-pixel 123 in the second direction to the size of the third sub-pixel 123 in the first direction to be less than 3.5, display symmetry of the pixel group can further be improved. It should be noted that the size of the above-mentioned third sub-pixel may be a size of the effective light-emitting region of the third sub-pixel.

In some examples, as shown in FIGS. 2A and 3A, the ratio of the size of the third sub-pixel 123 in the second direction to the size of the third sub-pixel 123 in the first direction is less than 2. In this way, by reducing the aspect ratio of the third sub-pixel 123, the centers of the first sub-pixels 121 and the centers of the second sub-pixels 122 that are adjacent to each other in the first sub-pixel row 310 can be set closer, for example, the included angle between the connection line of the center of the first sub-pixel 121 and the center of the second sub-pixel 122 that are adjacent to each other and the first direction is less than 15 degrees. On the other hand, by setting the ratio of the size of the third sub-pixel 123 in the second direction to the size of the third sub-pixel 123 in the first direction to be less than 2, the display symmetry of the pixel group can further be improved. It should be noted that the size of the above-mentioned third sub-pixel may be the size of the effective light-emitting region of the third sub-pixel.

In some examples, as shown in FIGS. 2A and 3A, the ratio of the size of the third sub-pixel 123 in the second direction to the size of the third sub-pixel 123 in the first direction is less than 1.2. In this way, the array substrate can further make the centers of the first sub-pixels and the centers of the second sub-pixels that are adjacent to each other in the first sub-pixel row set closer, and the display symmetry of the pixel group can be further improved.

In some examples, as shown in FIGS. 2A and 3A, the first sub-pixel 121 in one pixel group 120 in the i-th pixel group row 210 is at least partially located between two adjacent pixel groups 120 in the (i+1)-th pixel group row 210, for example, the first sub-pixel 121 is located between the third sub-pixel 123 and the fourth sub-pixel 124 that are adjacent to each other. That is, an orthographic projection of the i-th pixel group row 210 on a reference line extending along the second direction partially overlaps an orthographic projection of the (i+1)-th pixel group row 210 on a reference line extending along the second direction. In this way, the array substrate can arrange two pixel group rows 210 adjacent to each other more closely, so that the pixel density and opening rate can be improved.

For example, as shown in FIGS. 2A and 3A, an orthographic projection of the first sub-pixel 121 in one pixel group 120 in the i-th pixel group row 210 on the reference line extending along the second direction is at least partially overlapped with orthographic projections of the two adjacent pixel groups 120 in the (i+1)-th pixel group row 210 on the reference line extending along the second direction; and the orthographic projection of the first sub-pixel 121 in one pixel group 120 in the i-th pixel group row 210 on the reference line extending along the second direction is at least partially overlapped with orthographic projections of the third sub-pixel 123 and the fourth sub-pixel 124 which are adjacent to each other in the (i+1)-th pixel group row 210 on the reference line extending in the second direction.

In some examples, as shown in FIGS. 2A and 3A, the i-th pixel group row 210 is aligned with the (i+2)-th pixel group row 210 in the first direction, a first sub-pixel 121 in the i-th pixel group row 210 and a second sub-pixel 122 in the (i+2)-th pixel group row 210 form a sub-pixel pair 125, in the sub-pixel pair 125, a third connection line CL3 between the center of the first sub-pixel 121 and the center of the second sub-pixel 122 is parallel to the second direction. In this way, the array substrate has better display quality.

In some examples, as shown in FIGS. 2A and 3A, a farthest distance in the second direction between an effective light-emitting region of the first sub-pixel 121 and an effective light-emitting region of the second sub-pixel 122 in the sub-pixel pair 125 is greater than a size of the third sub-pixel 123 in the second direction and a size of the fourth sub-pixel 124 in the second direction.

In some examples, as shown in FIG. 3B, the array substrate 100 further includes a first color pixel electrode 141, a second color pixel electrode 142, a third color pixel electrode 143 and a fourth color pixel electrode 144 on the base substrate 110; a pixel definition layer 150 located at a side of the first color pixel electrode 141, the second color pixel electrode 142, the third color pixel electrode 143 and the fourth color pixel electrode 144 away from the base substrate 110; and a first color light-emitting layer 161, a second color light-emitting layer 162, a third color light-emitting layer 163 and a fourth color light-emitting layer 164 located at a side of the pixel definition layer 150 away from the base substrate 110. The pixel definition layer 150 includes a first opening 151, a second opening 152, a third opening 153 and a fourth opening 154, the first opening 151 exposes the first color pixel electrode 141, the second opening 152 exposes the second color pixel electrode 142, the third opening 153 exposes the third color pixel electrode 143, and the fourth opening 154 exposes the fourth color pixel electrode 144; the first color light-emitting layer 161 is arranged in contact with a part of the first color pixel electrode 141 exposed by the first opening 151 through the first opening 151; the second color light-emitting layer 162 is arranged in contact with a part of the second color pixel electrode 142 exposed by the second opening 152 through the second opening 152; the third color light-emitting layer 163 is arranged in contact with a part of the third color pixel electrode 143 exposed by the third opening 153 through the third opening 153; and the fourth color light-emitting layer 164 is arranged in contact with a part of the fourth color pixel electrode 144 exposed by the fourth opening 154 through the fourth opening 154. At this time, a shape and sizes of the effective light-emitting region of the first sub-pixel 121 are defined by the first opening 151, a shape and sizes of the effective light-emitting region of the second sub-pixel 122 are defined by the second opening 152, a shape and sizes of the effective light-emitting region of the third sub-pixel 123 are defined by the third opening 153, and a shape and sizes of the effective light-emitting region of the fourth sub-pixel 124 are defined by the fourth opening 154.

For example, the first color pixel electrode 141 is configured to drive the first color light-emitting layer 161 to emit light of the first color; the second color pixel electrode 142 is configured to drive the second color light-emitting layer 162 to emit light of the second color; the third color pixel electrode 143 is configured to drive the third color light-emitting layer 163 to emit light of the third color; and the fourth color pixel electrode 144 is configured to drive the fourth color light-emitting layer 164 to emit light of the fourth color.

For example, the first color and the second color are both green, the third color is red, and the fourth color is blue. Of course, the embodiments of the present disclosure include but are not limited to this.

In some examples, as shown in FIG. 3A, the first color light-emitting layer 161 of the first sub-pixel 121 and the second color light-emitting layer 162 of the second sub-pixel 122 in the sub-pixel pair 125 are integrated into a same light-emitting layer. That is, the first color light-emitting layer 161 of the first sub-pixel 121 and the second color light-emitting layer 162 of the second sub-pixel 122 in the sub-pixel pair 125 may be formed through a same opening of a same fine mask (FMM).

For example, as shown in FIG. 3A, the first sub-pixel 121 and the second sub-pixel 122 may be configured to emit light of a same color. However, because the distance between the third sub-pixel 123 and the fourth sub-pixel 124 in the same pixel group 120 is relatively close, the first color light-emitting layer 161 of the first sub-pixel 121 and the second color light-emitting layer 162 of the second sub-pixel 122 in the same pixel group 120 may not be integrated together. On the contrary, the first color light-emitting layer 161 of the first sub-pixel 121 and the second color light-emitting layer 162 of the second sub-pixel 122 in the sub-pixel pair 125 may be integrated into a same light-emitting layer.

In some examples, as shown in FIGS. 3A and 3B, the first sub-pixel 121 may include the first color pixel electrode 141 and the first color light-emitting layer 161 arranged on the first color pixel electrode 141 mentioned above; the second sub-pixel 122 includes the second color pixel electrode 142 and the second color light-emitting layer 162 arranged on the second color pixel electrode 142; the third sub-pixel 123 includes the third color pixel electrode 143 and the third color light-emitting layer 163 arranged on the third color pixel electrode 143; and the fourth sub-pixel 124 includes the fourth color pixel electrode 144 and the fourth color light-emitting layer 164 arranged on the fourth color pixel electrode 144. It should be noted that each of the above-mentioned light-emitting layers may only include a light-emitting layer that emit light directly, and may also include auxiliary functional film layers such as an electron transport layer, an electron injection layer, a hole transport layer, and a hole injection layer.

It should be noted that the shapes and sizes of the first sub-pixel, the second sub-pixel, the third sub-pixel and the fourth sub-pixel mentioned above may be the shapes and sizes of the effective light-emitting regions of the first sub-pixel, the second sub-pixel, the third sub-pixel and the fourth sub-pixel respectively, which may be defined by a first via hole, a second via hole, a third via hole and a fourth via hole mentioned above. Therefore, the shapes of the first color pixel electrode, the second color pixel electrode, the third color pixel electrode and the fourth color pixel electrode may be different from the shapes of the first sub-pixel, the second sub-pixel, the third sub-pixel and the fourth sub-pixel mentioned above. Of course, the embodiments of the present disclosure include but are not limited to this, the shapes of the first color pixel electrode, the second color pixel electrode, the third color pixel electrode and the fourth color pixel electrode may also be the same as the shapes of the first sub-pixel, the second sub-pixel, the third sub-pixel and the fourth sub-pixel mentioned above.

On the other hand, the specific shapes of the first color light-emitting layer, the second color light-emitting layer, the third color light-emitting layer and the fourth color light-emitting layer can be set according to the manufacturing process, which are not limited in the embodiments of the present disclosure. For example, the shape of the first color light-emitting layer may be determined by a shape of a mask opening in the manufacturing process.

In some examples, as shown in FIG. 3B, the size of the first color pixel electrode 141 is larger than a size of the first opening 151, the size of the second color pixel electrode 142 is larger than a size of the second opening 152, the size of the third color pixel electrode 143 is larger than a size of the third opening 153, and the size of the fourth color pixel electrode 144 is larger than a size of the fourth opening 154. Moreover, a distance by which the first color pixel electrode 141 exceeds the first opening 151, a distance by which the second color pixel electrode 142 exceeds the second opening 152, a distance by which the third color pixel electrode 143 exceeds the third opening 153, and a distance by which the fourth color pixel electrode 144 exceeds the fourth opening 154 are approximately equal. That is, a shortest distance between an edge of the first color pixel electrode 141 and an edge of the first opening 151, a shortest distance between an edge of the second color pixel electrode 142 and an edge of the second opening 152, a shortest distance between an edge of the third color pixel electrode 143 and an edge of the third opening 153, and a shortest distance between an edge of the fourth color pixel electrode 144 and an edge of the fourth opening 154 are approximately equal.

Figure 4:
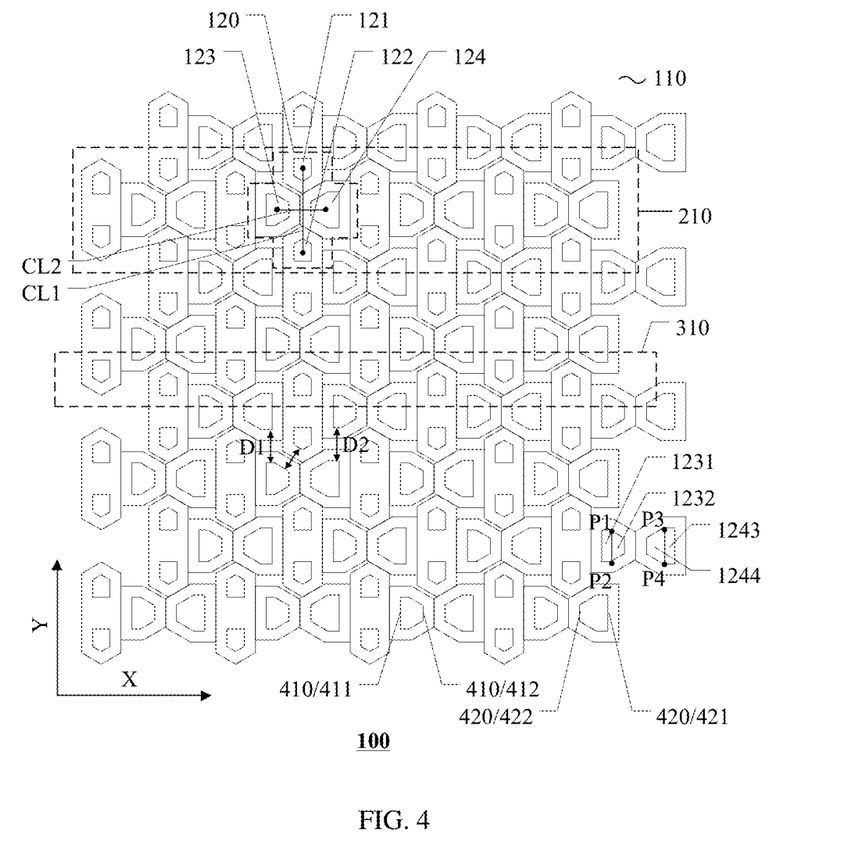
FIG. 4 is a schematic diagram of another array substrate provided by an embodiment of the present disclosure.
Figure 5:
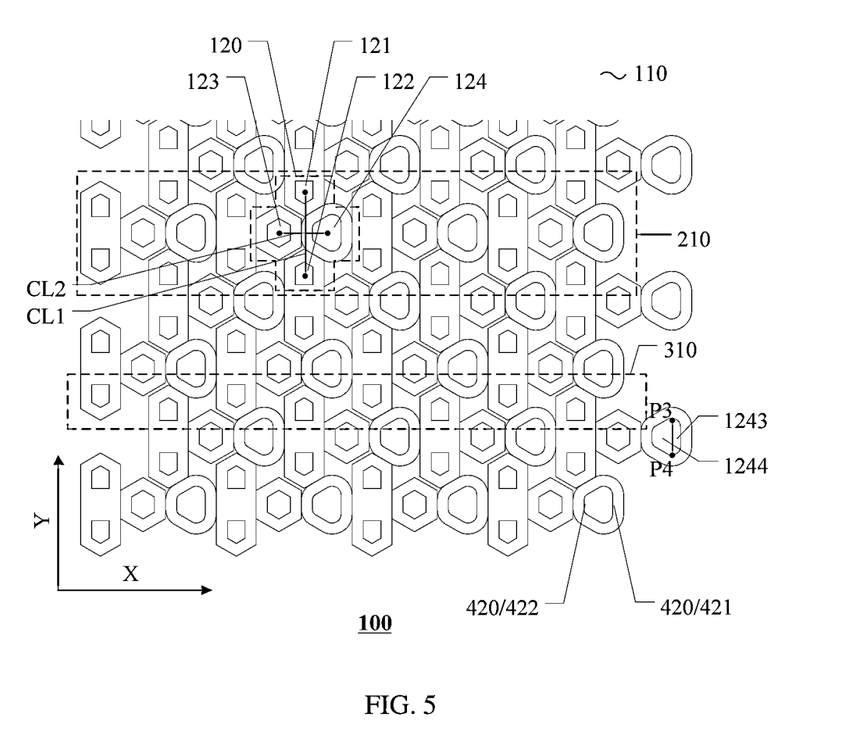
FIG. 5 is a schematic diagram of still another array substrate provided by an embodiment of the present disclosure.

FIG. 4 is a schematic diagram of another array substrate provided by an embodiment of the present disclosure; and FIG. 5 is a schematic diagram of still another array substrate provided by an embodiment of the present disclosure.

In some examples, as shown in FIGS. 4 and 5, a shape of an effective light-emitting region of a first sub-pixel 121 and a shape of an effective light-emitting region of a second sub-pixel 122 may both be symmetrical polygons, of course, the embodiments of the present disclosure include but are not limited to this.

In some examples, as shown in FIGS. 4 and 5, a shape of an effective light-emitting region of a third sub-pixel 123 and a shape of an effective light-emitting region of a fourth sub-pixel 124 may be a non-centrally symmetric polygon, so that the area of the array substrate can be fully utilized, thus the opening rate is increased.

For example, a number of sides of each of the shape of the effective light-emitting region of the first sub-pixel 121, the shape of the effective light-emitting region of the second sub-pixel 122, and the shape of the effective light-emitting region of the third sub-pixel 123 mentioned above is greater than five.

In some examples, as shown in FIG. 4, the shape of the effective light-emitting region of the third sub-pixel 123 includes a first parallel edge group 410, the first parallel edge group 410 includes a first parallel edge 411 and a second parallel edge 412 extending along the second direction; in one of the pixel groups 120, the first parallel edge 411 is located at a side of the second parallel edge 412 away from the fourth sub-pixel 124, a length of the first parallel edge 411 is greater than a length of the second parallel edge 412. In one of the pixel groups 120, a center connection line CL1 of a center of the first sub-pixel 121 and a center of the second sub-pixel 122 is located between a center of the third sub-pixel 123 and a center of the fourth sub-pixel 124, thus a larger space is provided on a side of the effective light-emitting region of the third sub-pixel 123 and the effective light-emitting region of the fourth sub-pixel 124 away from the center connection line CL1. Therefore, by setting the length of the first parallel edge to be greater than the length of the second parallel edge, on the one hand, the area of the effective light-emitting region of the third sub-pixel can be increased, on the other hand, a space utilization rate and the opening rate can be improved. It should be noted that the above-mentioned opening rate may be a ratio of the sum of the areas of the effective light-emitting regions of each of the sub-pixels in the array substrate to the area of the array substrate.

In some examples, as shown in FIGS. 4 and 5, the shape of the effective light-emitting region of the fourth sub-pixel 124 includes a second parallel edge group 420, the second parallel edge group 420 includes a third parallel edge 421 and a fourth parallel edge 422 extending along the second direction; in one of the pixel groups 120, the third parallel edge 421 is located at a side of the fourth parallel edge 422 away from the third sub-pixel 123, and a length of the third parallel edge 421 is greater than a length of the fourth parallel edge 422. In one of the pixel groups 120, the center connection line CL1 of the center of the first sub-pixel 121 and the center of the second sub-pixel 122 is located between the center of the third sub-pixel 123 and the center of the fourth sub-pixel 124, thus a larger space is provided on a side of the effective light-emitting region of the third sub-pixel 123 and the effective light-emitting region of the fourth sub-pixel 124 away from the center connection line CL1. Therefore, by setting the length of the third parallel edge to be greater than the length of the fourth parallel edge, on the one hand, the area of the effective light-emitting region of the fourth sub-pixel can be increased, and on the other hand, the space utilization rate and the opening rate can be improved.

It is worth noting that the extending directions of the first parallel edge, the second parallel edge, the third parallel edge and the fourth parallel edge are the same in a case that a fine metal mask (FMM) to manufacture the above-mentioned array substrate is adopted, and the extending directions can be a stretching direction of the fine metal mask (FMM), so that it is beneficial to the transmission of a tension force of the fine metal mask (FMM), and the product yield can be further improved.

In some examples, as shown in FIG. 4, the shape of the effective light-emitting region of the third sub-pixel 123 includes a first vertex P1 and a second vertex P2 with a largest distance in the second direction, the shape of the effective light-emitting region of the third sub-pixel 123 is divided into a first part 1231 and a second part 1232 by a connection line of the first vertex P1 and the second vertex P2; in one of the pixel groups 120, the first part 1231 is located at a side of the second part 1232 away from the fourth sub-pixel 124, an average size of the first portion 1231 in the second direction is larger than an average size of the second portion 1232 in the second direction. In one of the pixel groups 120, the center connection line CL1 of the center of the first sub-pixel 121 and the center of the second sub-pixel 122 is located between the center of the third sub-pixel 123 and the center of the fourth sub-pixel 124, thus a larger space is provided on a side of the effective light-emitting region of the third sub-pixel 123 and the effective light-emitting region of the fourth sub-pixel 124 away from the center connection line CL1. Therefore, by setting the size of the first portion in the second direction to be larger than the size of the second portion in the second direction, on the one hand, the area of the effective light-emitting region of the third sub-pixel can be increased, and on the other hand, the space utilization rate and the opening rate can be improved. It should be noted that the above-mentioned "average size" may be a weighted average size of the first part or the second part in the second direction.

In some examples, as shown in FIGS. 4 and 5, the shape of the effective light-emitting region of the fourth sub-pixel 124 includes the third vertex P3 and the fourth vertex P4 with a largest distance in the second direction, the shape of the effective light-emitting region of the fourth sub-pixel 124 is divided into a third part 1243 and a fourth part 1244 by a connection line of the third vertex P3 and the fourth vertex P4; in one of the pixel groups 120, the third portion 1243 is located at a side of the fourth portion 1244 away from the third sub-pixel 123, an average size of the third portion 1243 in the second direction is larger than an average size of the fourth portion 1244 in the second direction. In one of the pixel groups 120, the center connection line CL1 of the center of the first sub-pixel 121 and the center of the second sub-pixel 122 is located between the center of the third sub-pixel 123 and the center of the fourth sub-pixel 124, thus a larger space is provided on a side of the effective light-emitting region of the third sub-pixel 123 and the effective light-emitting region of the fourth sub-pixel 124 away from the center connection line CL1. Therefore, by setting the size of the third portion in the second direction to be larger than the size of the fourth portion in the second direction, on the one hand, the area of the effective light-emitting region of the fourth sub-pixel can be increased, and on the other hand, the space utilization rate and the opening rate can be improved.

In some examples, as shown in FIG. 5, because the luminous efficiency of the fourth sub-pixel 124 is reduced, its service life is also low, thus only the effective light-emitting region of the fourth sub-pixel 124 can be expanded outward, so that the area of the effective light-emitting region of the fourth sub-pixel is increased. At this time, the effective light-emitting region of the third sub-pixel 123 can still adopt a symmetrical shape.

In some examples, the luminous efficiency of the third sub-pixel 123 is greater than the luminous efficiency of the fourth sub-pixel 124, at this time, the area of the effective light-emitting region of the fourth sub-pixel 124 is larger than the area of the effective light-emitting region of the third sub-pixel 123. Because structure design and material system of the light-emitting devices are different, there are different service life of the sub-pixels that emit light of different colors. Therefore, by setting the area of the effective light-emitting region of the fourth sub-pixel to be larger than the area of the effective light-emitting region of the third sub-pixel, the above-mentioned difference in service life can be balanced, and an overall lifetime of the array substrate can be improved.

In some examples, as shown in FIGS. 4 and 5, a shortest distance D1 between the effective light-emitting region of one of the third sub-pixels 123 in the i-th pixel group row 210 and the effective light-emitting region of one of the fourth sub-pixels 124 in the (i+1)-th pixel group row 210 is less than twice the shortest distance between the effective light-emitting region of one of the first sub-pixels 121 and the effective light-emitting region of one of the third sub-pixels 123 in the same pixel group 120. In a common array substrate, the shortest distance between the effective light-emitting region of one of the third sub-pixels in the i-th pixel group row and the effective light-emitting region of one of the fourth sub-pixels in the (i+1)-th pixel group row is relatively large, in the array substrate provided by this example, by setting the above-mentioned shortest distance D1 to be less than twice the shortest distance between the effective light-emitting region of one of the first sub-pixels and the effective light-emitting region of one of the third sub-pixels in the same pixel group, the area of the third sub-pixel can be increased, and the opening rate can be improved.

In some examples, as shown in FIGS. 4 and 5, the shortest distance D1 between the effective light-emitting region of one of the third sub-pixels 123 in the i-th pixel group row 210 and the effective light-emitting region of one of the fourth sub-pixels 124 in the (i+1)-th pixel group row 210 is less than 1.5 times the shortest distance between the effective light-emitting region of one of the first sub-pixels 121 and the effective light-emitting region of one of the third sub-pixels 123 in the same pixel group 120. In this way, the array substrate can further increase the area of the third sub-pixel, and the opening rate can be improved.

In some examples, as shown in FIG. 5, a shortest distance D2 between the effective light-emitting region of one of the fourth sub-pixels 124 in the i-th pixel group row 210 and the effective light-emitting region of one of the third sub-pixels 123 in the (i+1)-th pixel group row 210 is less than twice a shortest distance between the effective light-emitting region of the first sub-pixel 121 and the effective light-emitting region of the fourth sub-pixel 124 in the same pixel group 120. In the common array substrate, the shortest distance between the effective light-emitting region of one of the fourth sub-pixels in the i-th pixel group row and the effective light-emitting region of one of the third sub-pixels in the (i+1)-th pixel group row is relatively large, in the array substrate provided in this example, by setting the above-mentioned shortest distance D2 to be less than twice the shortest distance between the effective light-emitting region of the first sub-pixel and the effective light-emitting region of the fourth sub-pixel in the same pixel group, the area of the fourth sub-pixel can be increased, and the opening rate can be improved.

In some examples, as shown in FIG. 5, the shortest distance D2 between the effective light-emitting region of one of the fourth sub-pixels 124 in the i-th pixel group row 210 and the effective light-emitting region of one of the third sub-pixels 123 in the (i+1)-th pixel group row 210 is less than 1.5 times the shortest distance between the effective light-emitting region of one of the first sub-pixels 121 and the effective light-emitting region of one of the fourth sub-pixels 124 in the same pixel group 120. In this way, the array substrate can further increase the area of the third sub-pixel, and the opening rate can be improved.

In some examples, as shown in FIG. 5, an edge of the effective light-emitting region of the fourth sub-pixel 124 may include a curved line.

In some examples, as shown in FIGS. 4 and 5, the first sub-pixel 121 in one of the pixel groups 120 in the i-th pixel group row 210 is at least partially located between two adjacent pixel groups 120 in the (i+1)-th pixel group row 210, for example, is located between the third sub-pixel 123 and the fourth sub-pixel 124 that are adjacent to each other. In this way, the array substrate can arrange two adjacent pixel group rows 210 more closely, so that the pixel density and the opening rate can be improved.

Figure 6:
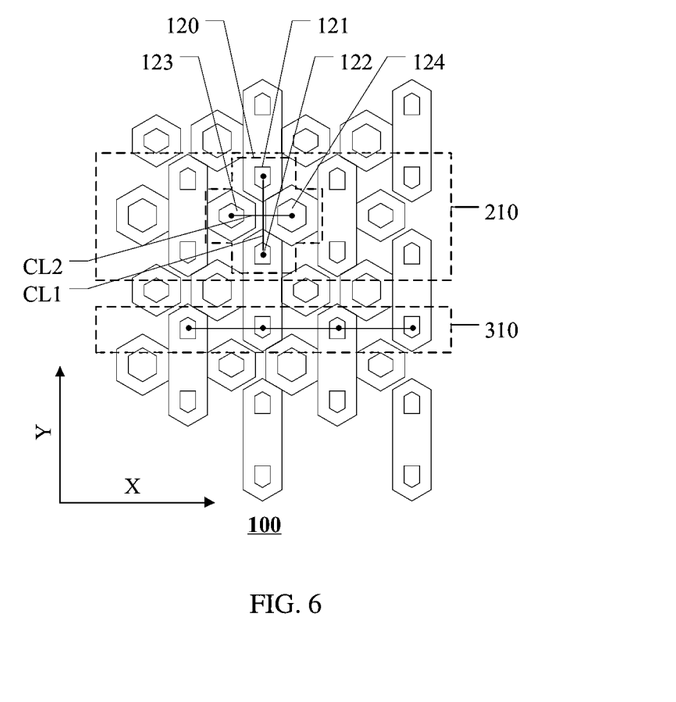
FIG. 6 is a schematic diagram of still another array substrate provided by an embodiment of the present disclosure.
Figure 7:
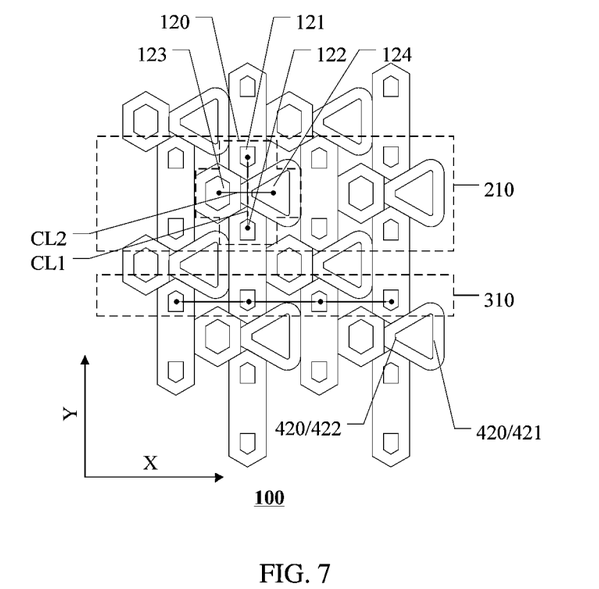
FIG. 7 is a schematic diagram of still another array substrate provided by an embodiment of the present disclosure.

FIG. 6 is a schematic diagram of still another array substrate provided by an embodiment of the present disclosure; and FIG. 7 is a schematic diagram of still another array substrate provided by an embodiment of the present disclosure.

As shown in FIG. 6 and FIG. 7, the array substrate 100 includes a base substrate 110 and a plurality of pixel groups 120 located on the base substrate 110; each of the plurality of pixel group 120 includes a first sub-pixel 121, a second sub-pixel 122, a third sub-pixel 123 and a fourth sub-pixel 124. In each of the plurality of pixel groups 120, a first connection line CL1 of a center of the first sub-pixel 121 and a center of the second sub-pixel 122 is intersected with a second connection line CL2 of a center of the third sub-pixel 123 and a center of the fourth sub-pixel 124. It should be noted that, in the pixel group 120, the first sub-pixel 121 and the second sub-pixel 122 can be sub-pixels emitting light with a same color; in addition, shapes of the first sub-pixel 121 and the second sub-pixel 122 may also be the same, a difference between the first sub-pixel 121 and the second sub-pixel 122 is that their positions are different. In addition, the above-mentioned "center" refers to a luminance center or a geometric center of an effective light-emitting region of each of the sub-pixels.

As shown in FIG. 6 and FIG. 7, the plurality of pixel groups 120 are arranged along the first direction to form N pixel group rows 210; the N pixel group rows 210 are arranged in the second direction, two pixel group rows 210 which are adjacent to each other are arranged in a staggered manner in the first direction, that is, centers of orthographic projections of the pixel groups with a same ordinal number in two pixel group rows 210 which are adjacent to each other on a reference line extending in the first direction do not overlap. Therefore, the two pixel group rows 210 which are adjacent to each other can be arranged closer and more closely in the second direction, so as to improve the pixel density or resolution.

As shown in FIG. 6 and FIG. 7, the plurality of first sub-pixels 121 in the i-th pixel group row 210 and the plurality of second sub-pixels 122 in the (i+1)-th pixel group row 210 are alternately arranged in the first direction, to form a first sub-pixel row 310; and in one of the first sub-pixel rows 310, an included angle θ between a connection line CL of the center of the first sub-pixel 121 and the center of the second sub-pixel 122 that are adjacent to each other and the first direction is less than or equal to 10 degrees, N is a positive integer greater than or equal to 3, and i is a positive integer greater than or equal to 1 and less than or equal to N.

In the array substrate provided by the embodiments of the present disclosure, the first sub-pixel 121 and the second sub-pixel 122 may be sub-pixels that emit light of a same color, and the color of the sub-pixels is sensitive to the human eye. Because the included angle θ between the connection line CL of the center of the first sub-pixels 121 and the center of the second subpixels 122 that are adjacent to each other in the first subpixel row 310 and the first direction is less than or equal to 10 degrees, the sense of fluctuation of the first sub-pixel row 310 is smaller, and the first sub-pixel row 310 is closer to a straight line in human vision, so that the "sense of fluctuation" or "sense of jaggedness" of the display image can be alleviated or even eliminated, and thus the lines of the display image are more continuous and natural.

For example, in one of the first sub-pixel rows 310, the included angle θ between the connection line CL of the centers of the first sub-pixels 121 and the centers of the second sub-pixels 122 that are adjacent to each other and the first direction is equal to 0 degrees; that is, the centers of all the first sub-pixels 121 and the centers of the second sub-pixels 122 in the first sub-pixel row 310 may be located on a same straight line, and the straight line is parallel to the first direction. Therefore, the array substrate can eliminate the sense of fluctuation of the first sub-pixel row 310, so that the "sense of fluctuation" or "sense of jaggedness" of the display image is eliminated.

In some examples, as shown in FIGS. 6 and 7, the first sub-pixel rows 310 may be uniformly arranged in the second direction, that is, distances between any two adjacent first sub-pixel rows 310 are equal, so that the uniformity and symmetry of the pixel arrangement of the array substrate are further improved, thus the display quality can be further improved.

In some examples, as shown in FIG. 7, because the luminous efficiency of the fourth sub-pixel 124 is reduced, the service life is also low, thus only the effective light-emitting region of the fourth sub-pixel 124 can be expanded outward, so that the area of the effective light-emitting region of the fourth sub-pixel is increased.

For example, as shown in FIG. 7, the shape of the effective light-emitting region of the fourth sub-pixel 124 includes a second parallel edge group 420, the second parallel edge group 420 includes a third parallel edge 421 and a fourth parallel edge 422 extending along the second direction; in one of the pixel groups 120, the third parallel edge 421 is located at a side of the fourth parallel edge 422 away from the third sub-pixel 123, a length of the third parallel edge 421 is greater than a length of the fourth parallel edge 422. In one of the pixel groups 120, the center connection line CL1 of the first sub-pixel 121 and the second sub-pixel 122 is located between the center of the third sub-pixel 123 and the center of the fourth sub-pixel 124, thus a larger space is provided on a side of the effective light-emitting region of the third sub-pixel 123 and the effective light-emitting region of the fourth sub-pixel 124 away from the center connection line CL1. Therefore, by setting the length of the third parallel edge to be greater than the length of the fourth parallel edge, on the one hand, the area of the effective light-emitting region of the fourth sub-pixel can be increased, and on the other hand, the space utilization rate and the opening rate can be improved.

In some examples, the luminous efficiency of the third sub-pixel 123 is greater than the luminous efficiency of the fourth sub-pixel 124, at this time, the area of the effective light-emitting region of the fourth sub-pixel 124 is larger than the area of the effective light-emitting region of the third sub-pixel 123. Because structure design and material system of the light-emitting devices are different, there are different service life of the sub-pixels that emit light of different colors. Therefore, by setting the area of the effective light-emitting region of the fourth sub-pixel to be larger than the area of the effective light-emitting region of the third sub-pixel, the above-mentioned difference in service life can be balanced, and an overall service life of the array substrate can be improved.

Figure 8:
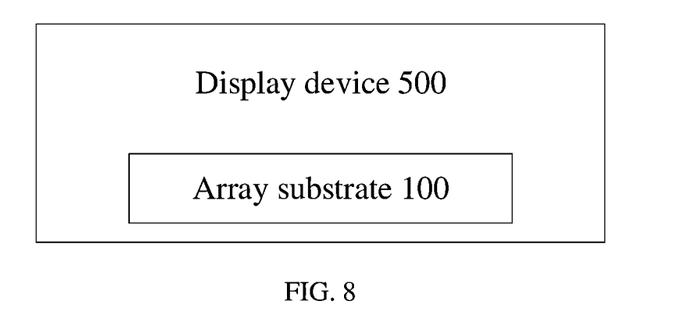
FIG. 8 is a schematic diagram of a display device provided by an embodiment of the present disclosure.

At least one embodiment of the present disclosure further provides a display device. FIG. 8 is a schematic diagram of a display device provided by an embodiment of the disclosure. As shown in FIG. 8, the display device 500 includes the above-mentioned array substrate 100. Because the included angle between the connection line of the center of the first sub-pixels and the center of the second sub-pixels that are adjacent to each other in the first sub-pixel row and the first direction is less than 20 degrees in the array substrate, the sense of fluctuation of the first sub-pixel row is smaller, the first sub-pixel row is closer to a straight line in human vision, so that the "sense of fluctuation" or "sense of jaggedness" of the display image can be alleviated or even eliminated, thus the display device can have a higher resolution, at the same time, the display device has a high display quality.

For example, in some examples, the display device can be any product or component with a display function, such as a smart phone, a tablet computer, a TV, a monitor, a notebook computer, a digital photo frame, and a navigator.

The Following Points Required to be Explained:

(1) the drawings of the embodiments of the present disclosure only relate to the structures related to the embodiments of the present disclosure, and other structures can refer to the general design.

(2) without conflict, the embodiments of the present disclosure and the features in the embodiments may be combined with each other to obtain new embodiments.

The above are only the specific embodiments of this disclosure, but the scope of protection of this disclosure is not limited to this. Any person familiar with this technical field can easily think of changes or substitutions within the technical scope disclosed in this disclosure, which should be covered by the scope of protection of this disclosure. Therefore, the scope of protection of this disclosure should be based on the scope of protection of the claims.

What is claimed is:

1. An array substrate, comprising:
a plurality of first sub-pixel rows, wherein each of the first sub-pixel rows comprises a plurality of first sub-pixels and a plurality of second sub-pixels alternately arranged in a first direction; and
a plurality of second sub-pixel rows, wherein each of the second sub-pixel rows comprises a plurality of third sub-pixels and a plurality of fourth sub-pixels alternately arranged in the first direction,
wherein the plurality of first sub-pixel rows and the plurality of second sub-pixel rows are alternately arranged along a second direction, and the second direction is intersected with the first direction, and
in each of the first sub-pixel rows, an included angle between a connection line of a center of one of the first sub-pixels and a center of one of the second sub-pixels which are adjacent to each other and the first direction is less than 20 degrees,
the array substrate further comprises:
a plurality of pixel groups, each of the plurality of pixel groups comprises one of the first color sub-pixels, one of the second sub-pixels, one of the third sub-pixels and one of the fourth sub-pixels,
wherein, in each of the plurality of pixel groups, a first connection line of a center of the one of the first sub-pixels and a center of the one of the second sub-pixels is intersected with a second connection line between a center of the one of the third sub-pixels and a center of the one of the fourth sub-pixels,
the plurality of pixel groups are arranged along the first direction to form N pixel group rows, the N pixel group rows are arranged in the second direction, two adjacent ones of the pixel group rows are arranged in a staggered manner in the first direction, and multiple first sub-pixels in an i-th pixel group row and multiple second sub-pixels in an (i+1)-th pixel group row are alternately arranged in the first direction, to form one of the first sub-pixel rows, multiple third sub-pixels and multiple fourth sub-pixels in the i-th pixel group row are alternately arranged in the first direction, to form one of the second sub-pixel rows, N is a positive integer greater than or equal to 3, and i is a positive integer greater than or equal to 1 and less than or equal to N.

2. The array substrate according to claim 1, wherein the first sub-pixels are configured to emit light of a first color, the second sub-pixels are configured to emit light of a second color, and the first color and the second color are the same.

3. The array substrate according to claim 2, wherein the third sub-pixels are configured to emit light of a third color, the fourth sub-pixels are configured to emit light of a fourth color, the third color, the fourth color and the first color are different from each other, and a luminous efficiency of each of the third sub-pixels is greater than a luminous efficiency of each of the fourth sub-pixels.

4. The array substrate according to claim 1, wherein in one of the first sub-pixel rows, the included angle between the connection line of the center of the one of the first sub-pixels and the center of the one of the second sub-pixels which are adjacent to each other and the first direction is less than 15 degrees.

5. The array substrate according to claim 4, wherein in one of the first sub-pixel rows, the included angle between the connection line of the center of the one of the first sub-pixels and the center of the one of the second sub-pixels which are adjacent to each other and the first direction is less than or equal to 10 degrees.

6. The array substrate according to claim 1, wherein each of the first sub-pixels and each of the second sub-pixels in one of the first sub-pixel rows are intersected with a first virtual straight line extending in the first direction.

7. The array substrate according to claim 1, wherein the plurality of the first sub-pixels and the plurality of the second sub-pixels in one of the first sub-pixel rows are uniformly distributed in the first direction.

8. The array substrate according to claim 1, wherein a ratio of a maximum size of one of the third sub-pixels in the second direction to a maximum size of the one of the third sub-pixels in the first direction is less than 2.

9. The array substrate according to claim 8, wherein the ratio of the maximum size of the one of the third sub-pixels in the second direction to the maximum size of the one of the third sub-pixels in the first direction is less than 1.2.

10. The array substrate according to claim 1, wherein a shape of an effective light-emitting region of one of the third sub-pixels comprises a first parallel edge group, the first parallel edge group comprises a first parallel edge and a second parallel edge extending along the second direction, and in one of the pixel groups, the first parallel edge is located at a side of the second parallel edge away from the fourth sub-pixel, and a length of the first parallel edge is greater than a length of the second parallel edge.

11. The array substrate according to claim 1, wherein a shape of an effective light-emitting region of one of the fourth sub-pixels comprises a second parallel edge group, the second parallel edge group comprises a third parallel edge and a fourth parallel edge extending along the second direction, and in one of the pixel groups, the third parallel edge is located at a side of the fourth parallel edge away from the third sub-pixel, and a length of the third parallel edge is greater than a length of the fourth parallel edge.

12. The array substrate according to claim 1, wherein a shape of the effective light-emitting region of one of the third sub-pixels comprises a first vertex and a second vertex with a largest distance in the second direction, the shape of the effective light-emitting region of the one of the third sub-pixels is divided into a first part and a second part by a connection line of the first vertex and the second vertex, and in one of the pixel groups, the first part is located at a side of the second part away from the fourth sub-pixels, and an average size of the first part in the second direction is greater than an average size of the second part in the second direction.

13. The array substrate according to claim 1, wherein the shape of the effective light-emitting region of one of the fourth sub-pixels comprises a third vertex and a fourth vertex with a largest distance in the second direction, the shape of the effective light-emitting region of the fourth sub-pixel is divided into a third part and a fourth part by a connection line of the third vertex and the fourth vertex, and in one of the pixel groups, the third part is located at a side of the fourth part away from the third sub-pixel, an average size of the third part in the second direction is greater than an average size of the fourth part in the second direction.

14. The array substrate according to claim 1, wherein a shortest distance D1 between an effective light-emitting region of one of the third sub-pixels in the i-th pixel group row and an effective light-emitting region of one of the fourth sub-pixels in the (i+1)-th pixel group row is less than twice a shortest distance between an effective light-emitting region of one of the first sub-pixels and an effective light-emitting region of one of the third sub-pixels in a same pixel group.

15. The array substrate according to claim 1, wherein a shortest distance D2 between an effective light-emitting region of one of the fourth sub-pixels in the i-th pixel group row and an effective light-emitting region of one of the third sub-pixels in the (i+1)-th pixel group row is less than twice a shortest distance between the effective light-emitting region of one of the first sub-pixels and the effective light-emitting region of one of the fourth sub-pixels in a same pixel group.

16. The array substrate according to claim 1, wherein the first sub-pixel in one of the pixel groups in the i-th pixel group row is at least partially located between two adjacent pixel groups in the (i+1)-th pixel group row.

17. The array substrate according to claim 1, wherein the i-th pixel group row is aligned with the (i+2)-th pixel group row in the first direction, one of the first sub-pixels in the i-th pixel group row and one of the second sub-pixels in the (i+2)-th pixel group row form a sub-pixel pair, and in the sub-pixel pair, a third connection line of a center of the first sub-pixel and a center of the second sub-pixel is parallel to the second direction.

18. An array substrate, comprising:
a plurality of first sub-pixel rows, wherein each of the first sub-pixel rows comprises a plurality of first sub-pixels and a plurality of second sub-pixels alternately arranged in a first direction; and
a plurality of second sub-pixel rows, wherein each of the second sub-pixel rows comprises a plurality of third sub-pixels and a plurality of fourth sub-pixels alternately arranged in the first direction, wherein the plurality of first sub-pixel rows and the plurality of second sub-pixel rows are alternately arranged along a second direction, and the second direction is intersected with the first direction, and in each of the first sub-pixel rows, an included angle between a connection line of a center of one of the first sub-pixels and a center of one of the second sub-pixels which are adjacent to each other and the first direction is less than 20 degrees, wherein the array substrate further comprises:

a spacer, wherein the spacer is located between one of the first sub-pixels and one of the second sub-pixels which are adjacent to each other in the first sub-pixel row, a number of the plurality of the second sub-pixel rows is K, the spacer is further located between the third sub-pixel in a j-th second sub-pixel row and the fourth sub-pixel in a (j+1)-th second sub-pixel row, or the spacer is further located between the fourth sub-pixel in a j-th second sub-pixel row and the third sub-pixel in a (j+1)-th second sub-pixel row, K is a positive integer greater than or equal to 3, and j is a positive integer greater than or equal to 1 and less than or equal to K.

19. A display device, comprising the array substrate according to claim 1.

* * * * *